(12) United States Patent
Grayson et al.

(10) Patent No.: US 10,215,796 B2
(45) Date of Patent: Feb. 26, 2019

(54) SYSTEM AND METHOD FOR DEDUCING CHARGE DENSITY GRADIENTS IN DOPED SEMICONDUCTORS

(71) Applicant: Northwestern University, Evanston, IL (US)

(72) Inventors: Matthew Grayson, Evanston, IL (US); Wang Zhou, Evanston, IL (US)

(73) Assignee: Northwestern University, Evanston, IL (US)

( * ) Notice: Subject to any disclaimer, the term of this patent is extended or adjusted under 35 U.S.C. 154(b) by 424 days.

(21) Appl. No.: 15/151,216

(22) Filed: May 10, 2016

(65) Prior Publication Data
US 2016/0334457 A1    Nov. 17, 2016

Related U.S. Application Data

(60) Provisional application No. 62/159,782, filed on May 11, 2015.

(51) Int. Cl.
*G01R 31/26* (2014.01)

(52) U.S. Cl.
CPC .................. *G01R 31/2648* (2013.01)

(58) Field of Classification Search
CPC G01R 31/26; G01R 31/2642; G01R 31/2648; G01R 31/2831; G01R 31/31702
See application file for complete search history.

(56) References Cited

U.S. PATENT DOCUMENTS

| 3,915,765 | A | 10/1975 | Cho et al. |
| 5,365,456 | A | 11/1994 | Subbiah |
| 8,680,536 | B2 | 3/2014 | Khalil et al. |
| 8,798,947 | B2 | 8/2014 | Prance et al. |
| 2013/0257472 | A1* | 10/2013 | Kamieniecki ........... H01L 22/14 324/762.01 |
| 2014/0163913 | A1* | 6/2014 | Dubois ................ G01N 27/041 702/65 |
| 2015/0022223 | A1* | 1/2015 | Grayson .................. G01R 1/07 324/663 |

FOREIGN PATENT DOCUMENTS

| WO | 95/35491 A1 | 12/1995 |
| WO | 2013/134422 A1 | 9/2013 |

OTHER PUBLICATIONS

Ilan, R.; et al. "Longitudinal resistance of a quantum Hall system with a density gradient," Phys. Rev. B, 2006, 73, 9 pages.
Kim, B.S.; et al. "Generalized four-point characterization method using capacitive and ohmic contacts," Rev. Sci. Instrum., 2012, 83, 12 pages.
Pan, W.; et al. "Quantization of the Diagonal Resistance: Density Gradients and the Empirical Resistance Rule in a 2D System," Phys. Rev. Lett., 2005, 95, 4 pages.
Zhou, W.; et al. "Analyzing Longitudinal Magnetoresistance Asymmetry to Quantify Doping Gradients: Generalization of the van der Pauw Method," Phys. Rev. Lett., 2015, 115, 5 pages.

* cited by examiner

*Primary Examiner* — Tung X Nguyen
(74) *Attorney, Agent, or Firm* — Benesch, Friedlander, Coplan & Aronoff LLP

(57) ABSTRACT

A system and a method determine a quality of a doped semiconductor layer in terms of a charge carrier density gradient by measuring two magnetic-field-dependent resistances using four contacts of a specimen.

20 Claims, 6 Drawing Sheets

SYSTEM AND METHOD FOR DEDUCING CHARGE DENSITY GRADIENTS IN DOPED SEMICONDUCTORS

CROSS-REFERENCE TO RELATED APPLICATIONS

This patent application claims the benefit of U.S. Provisional Patent Application No. 62/159,782, filed on May 11, 2015, the entire contents of which is incorporated by reference in its entirety.

BACKGROUND

Doped semiconductor layers include bulk doped substrate wafers, modulation-doped quantum wells and oxide-semiconductor interfaces. In bulk materials, inhomogeneities in the doping arise from ingot processing from both Czochralski and Bridgeman crystal preparation methods, and can lead to inferior performance in high power devices and/or process variations from device to device for the same ingot. In any doped semiconductor layer, inhomogeneities can arise either in vapor-deposition growth or molecular epitaxy growth due to the asymmetric manner of dopant deposition. Uniformity of the charge carrier density limits batch reproducibility from device to device. A conventional method to examine the uniformity of electron density is to measure the local electron density at every spot of a wafer and generate a density distribution map. This method can require at least three or more samples to be measured to determine both components of a local density gradient, tripling the time and material used to quantify local dopant uniformity.

DESCRIPTION

A longitudinal magnetoresistance asymmetry (LMA) between positive versus negative magnetic field is observed in both the quantum Hall regime at low temperature and in the classical Drude regime at higher temperatures. By analyzing the current stream-function in van der Pauw measurement geometry in the latter high temperature Drude regime, the electron density gradient in the samples can be quantitatively determined from this LMA. Results agree well with gradients interpolated from local densities calibrated across an entire wafer. While resolving a longstanding question about magnetoresistance asymmetry, the systems and methods can quantify density gradients common to semiconductor systems.

Applications for the systems and methods include semiconductor quality examination, testing and calibration of semiconductor-producing systems, and new designs of semiconductor characterization instruments, and/or quantum well characterization, etc. Advantages include fewer samples are needed to be examined, and therefore the time and material usage necessary to reveal the quality of 2D semiconductors can be reduced. The systems and methods make it possible to examine individual samples, e.g., instead of testing multiple neighboring samples. The systems and methods can accelerate testing and calibration cycles of semiconductor-producing systems for both the manufacturers and users. The systems and methods can also improve the accuracy of measuring doping density gradients. The systems and methods can also enlighten new designs of semiconductor characterization apparatuses for instrument companies.

Figure 1A:
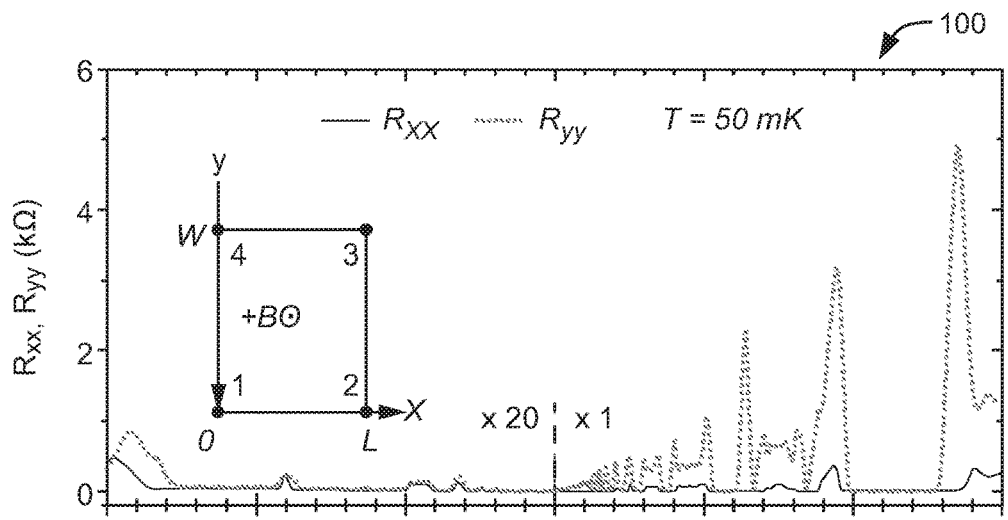
FIGS. 1A-C are graphs illustrating example asymmetric longitudinal resistance in van der Pauw (vdP) samples in both the quantum Hall (QH) (FIGS. 1A, 1B) and classical Drude (FIG. 1C) regimes.
Figure 1B:
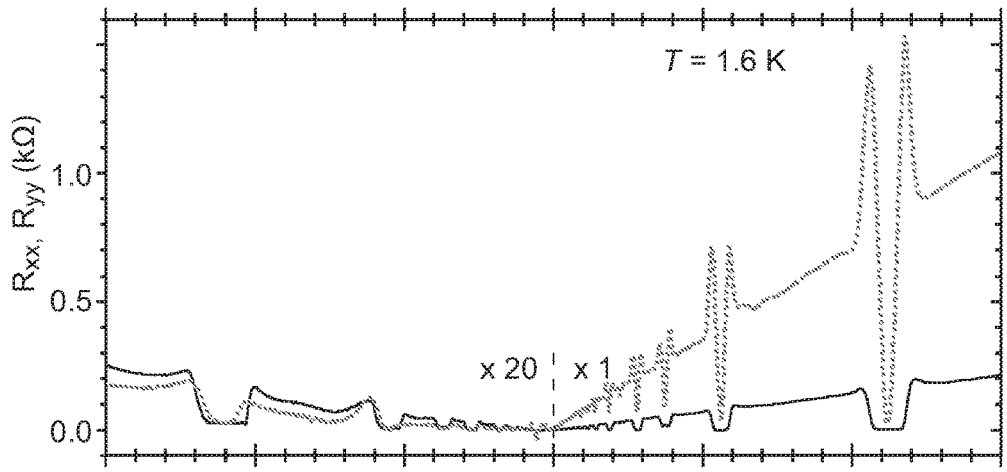
Figure 1C:
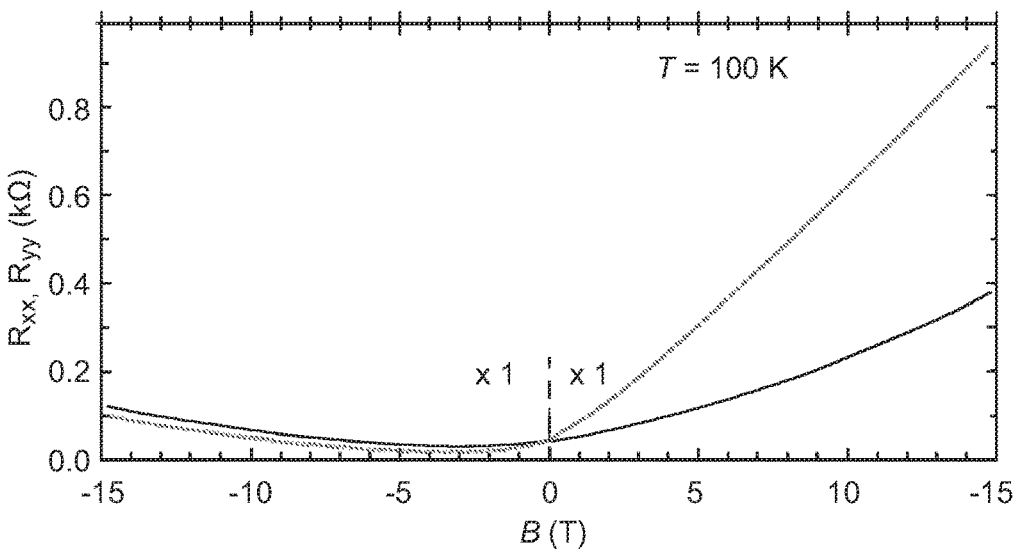

FIGS. 1A-B are graphs 100 illustrating example asymmetric longitudinal resistance in van der Pauw (vdP) samples in the quantum Hall (QH) regime. FIG. 1C illustrates the asymmetric longitudinal resistance in the same sample in the classical Drude regime, upon entering the Drude limit at higher temperatures. Here the longitudinal magnetoresistance asymmetry (LMA) can be quantitatively explained with a model that assumes a density gradient in a classical Drude conductor. The LMA analysis determines the magnitude and direction of the density gradient ∇n as well as the local resistivity $\rho_0(B)$ from a consideration of four-point resistances, measured using contact point terminals 1, 2, 3, 4 for current and voltage contacts of a measuring device, at both positive and negative B-fields (see insert FIG. 1A). In other implementations other amounts of contact points can be measured, e.g., more than four contact points. The rectangular sample of length L and width W is in the magnetic field B. The coordinate system is along the sample edges, with +B out of the page. The systems and methods can characterize magnetotransport measurements, allowing the determination of density gradients with an extension of the standard vdP method. The LMA system and method can be verified on square samples cleaved from a high-mobility gallium arsenide (GaAs) quantum well (QW) wafer, as described below. Both the angle and magnitude of the density gradients match those interpolated from local electron density measurements.

The graphs 100 in FIG. 1A-C are based on measurements of a 4'4 mm$^2$ sample taken from a 2-inch wafer hosting a 30 nm-wide GaAs QW, with an average electron density $\bar{n}=2.6\times10^{11}$ cm$^{-2}$ and mobility $\bar{\mu}=6.6\times10^6$ cm$^2$/V·s at T=1 K. The wafer can be grown by molecular beam epitaxy in a Gen II Varian chamber without any rotation during growth, leading to moderate density gradients as large as 20%/cm caused by the asymmetric positioning of the Ga, Al, and Si-dopant fluxes. The wafer is diced into 4×4 mm$^2$ square samples that can be each contacted with four indium dots on the corners and four on the flats of each side, and then alloyed. Samples can be measured in both a dilution refrigerator and the helium flow cryostat (T=50 mK-300 K) with standard lock-in techniques.

FIGS. 1A-C illustrates the two longitudinal resistances $R_{xx}=R_{43,12}$ and $R_{yy}=R_{32,41}$ of sample D4 measured at ±B-fields at T=50 mK, 1.6 K and 100 K. The notation $R_{43,12}$ means current is sent from contact 4 to 3, and voltage is measured at contact 1 relative to 2. According to the symmetry of the measurement, a perfectly homogeneous sample is expected to exhibit the same longitudinal resistances $R_{xx}$ and $R_{yy}$ for +B and −B-fields. However, at the lowest temperatures an extreme anisotropy is observed in the QH $R_{xx}$ and $R_{yy}$ traces (FIG. 1A), which decreases with increasing temperature (FIG. 1B), but still persists up to the Drude limit at T=100 K (FIG. 1C). For purposes of explanation, the description below focuses on the high temperature Drude regime where quantum oscillations vanish. To stay within the Drude limit for the samples, the temperature can be kept above T≥30 K to suppress quantum oscillations and below T≤100 K to avoid parallel conduction in the doping layers.

To theoretically model the observed LMA, a rectangular sample (FIG. 1A insert) with a local density gradient can be used. The density gradient can be oriented in an arbitrary direction. The resistivities obey the local Drude equations $\rho_{xx}(r)=1/n(r)e\mu(r)$ and $\rho_{xy}(r)=B/n(r)e$, and a stream function $\psi$ describes the current density $j(r)=\hat{z}\times\nabla\psi(r)$. The local electric field $E(r)=\rho(r)j(r)$ satisfies $\nabla\times E=0$ in steady state, leading to:

$$\rho_{xx}\nabla^2\psi+\nabla\rho_{xx}\cdot\nabla\psi-\hat{z}\cdot(\nabla\psi\times\nabla\rho_{xy})=0. \quad \text{(Equation 1)}$$

The subscript "0" identifies local measurables at the center of the sample, whereby $n_0$ is the density, $\mu_0(B)$ the B-dependent mobility, and $\rho_0(B)=1/n_0e\mu_0(B)$ the B-dependent Drude resistivity at the center of the sample.

The $\rho_{xx}$ and $\rho_{xy}$ gradients can be determined in terms of the density gradient. The normalized density gradient can be defined as:

$$\eta = (\eta_x, \eta_y) = \frac{\nabla n}{n_o}, \quad \text{(Equation 2)}$$

and spatial variations in mobility estimated according to the screening assumption of a power-law dependence on density $\mu(r)=\mu_0\cdot(n(r)/n_0)^\gamma$, typically $0.5<\gamma<1.5$. The resulting resistivity gradients become $\nabla\rho_{xx}=-\rho_0(1+\gamma)\eta$ and $\nabla\rho_{xy}=-\rho_0\mu_0 B\eta$.

Equation 1 can be evaluated keeping all derivative terms up to 1st order, and the four-point longitudinal resistance at finite B becomes $$R_{xx} = R_{43,12} \quad \text{(Equation 3)}$$

$$= -\frac{\rho_o}{I}\int_{x_2}^{x_1}\left(-\frac{\partial\psi}{\partial y}\right)_{y=0}dx$$

$$= e^{W/2\xi_x}\sum_{m=1}^{\infty}\frac{2m^2\pi^2 L\rho_0\lambda_m}{\sinh\left(\frac{1}{2}\lambda_m W\right)}\frac{[1-(-1)^m\cosh(L/2\xi_y)]}{[(L/2\xi_y)^2+m^2\pi^2]_2},$$

with length scale $\xi=(\xi_x, \xi_y)$ determined in terms of the components of $\eta$ $$\frac{1}{\xi_x} = -\mu_0 B\eta_x - (1+\gamma)\eta_y, \quad \text{(Equation 4)}$$

$$\frac{1}{\xi_y} = -\mu_0 B\eta_y + (1+\gamma)\eta_x,$$

whereby $$\lambda_m = \sqrt{[B^2\mu_0^2+(1+\gamma)^2]\eta^2+4m^2\pi^2/L^2}. \quad \text{(Equation 5)}$$

The analogous expression for $R_{yy}=R_{32,41}$ follows from the simple rotation transformation $x\to -y$, $y\to x$, $\xi_x\to -\xi_y$, $\xi_y\to \xi_x$, and $L\leftrightarrow W$.

For purposes of explanation, consider physically reasonable density gradients across a roughly square sample (W∼L), such that the percent of density variation $\delta$ determines a small parameter, $$\delta = \frac{\Delta n}{n_0} = |\eta\cdot(L\hat{x}+W\hat{y})|. \quad \text{(Equation 6)}$$

Here $\Delta n$ represents the maximum change in density across the sample, and the relative accuracy of all expressions below are specified in terms of $\delta$.

The angle of the density gradient $\theta$ is identified over the full range of B. Upon evaluating the ratio $R_{xx}(+B)/R_{xx}(-B)$ from Equation 3, the B-symmetric component of the exponential prefactor cancels, as does the summation term which is approximately symmetric in B for small $\delta$, leaving $$\ln\frac{R_{xx}(+B)}{R_{xx}(-B)} = -W\eta_x\mu_0(B)B. \quad \text{(Equation 7)}$$

The corresponding expression for $R_{yy}$ follows from the rotation transformation, and combined with Equation 7 the density gradient angle $\theta$ becomes, $$\tan\theta = \frac{\eta_y}{\eta_x} = -\frac{\ln\frac{R_{yy}(+B)}{R_{yy}(-B)}}{\ln\frac{R_{xx}(+B)}{R_{xx}(-B)}}\cdot\frac{W}{L}, \quad \text{(Equation 8)}$$

accurate to within an error of less than $$\frac{1}{2}\delta.$$

Figure 2A:
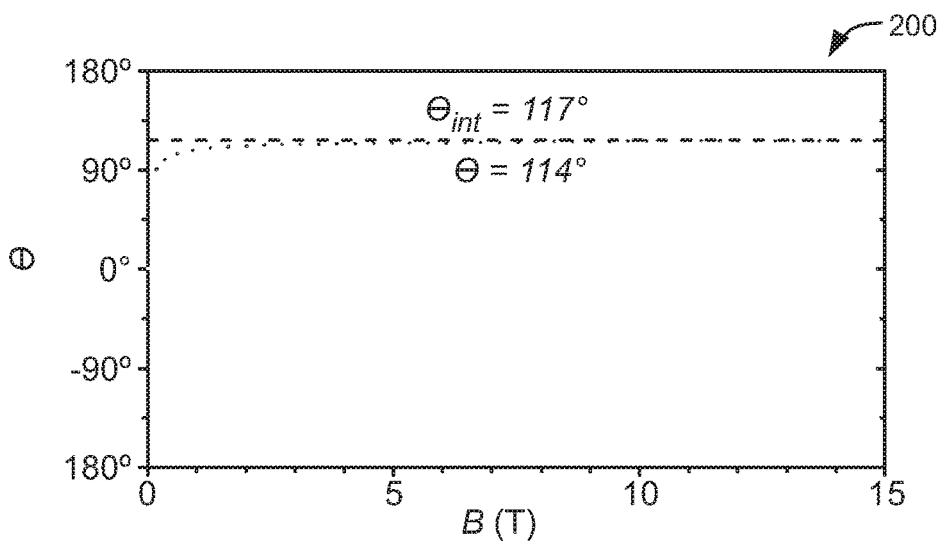
FIGS. 2A-C are graphs of example gradient angle θ, resistivity $\rho_0$, and gradient parameters $f_x$ and $f_y$ plotted as a function of B for sample D4 in the classical Drude regime.

To test Equation 8, an interpolated density gradient angle $\theta_{int}$ can be determined from the densities of neighboring samples. FIG. 2A compares the interpolated result $\theta_{int}=117°$ to $\theta$ from the LMA method of Equation 8. The gradient angle $\theta$ compares favorably and is constant at 114° over the entire range except for the lowest magnetic fields.

Figure 2B:
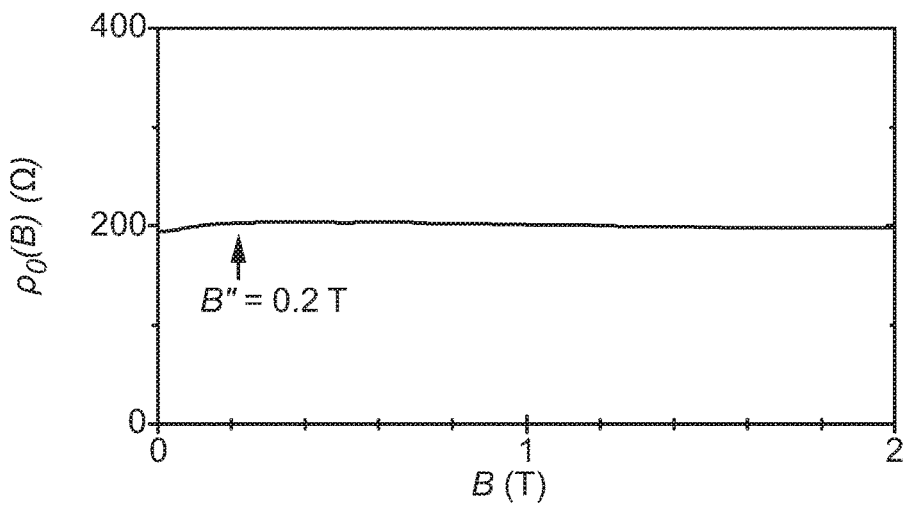
Figure 2C:
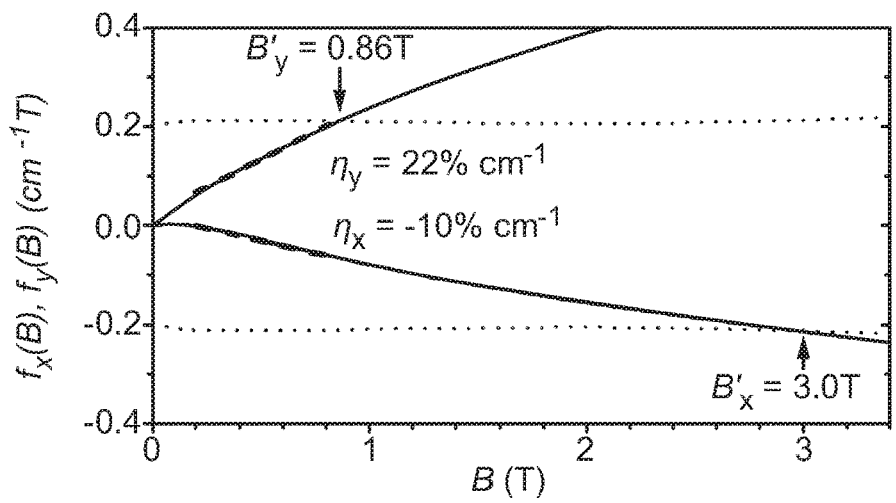

FIGS. 2A-C are graphs 200 of example gradient angle $\theta$, resistivity $\rho_0$, and gradient parameters $f_x$ and $f_y$ plotted as a function of B for sample D4. In FIG. 2A, the dotted line $\theta$ is constant 114° except at the lowest B, and compares favorably to the dashed line $\theta_{int}=117°$ interpolated from neighboring samples. In FIG. 2B, $\rho_0(B)$ exhibits flat Drude behavior everywhere except below B"=0.2 T. In FIG. 2C, normalized density gradient components $\eta_x$ and $\eta_y$ determined from the slopes of the linear fitting lines of $f_x(B)$ and $f_y(B)$ within B"<B<B'.

The B-dependent local resistivity, $\rho_0(B)$, is determined in the low B limit. From Equation 5 and its rotation transform, $\lambda_m$ is independent of B below $B'_x=1/\mu_0|\eta_x|W$ and $B'_y=1/$ $\mu_0|\eta_y|L$. The value $B'=\min\{B'_x, B'_y\}$ therefore determines the field $B \le B'$ below which the approximation $\lambda_m \approx 2m\pi/L$ is valid. This case can be more likely to occur in smaller samples or at higher resistivities $\rho_0$, which can be found at higher temperatures in high mobility samples. Equation 3 becomes $$R_{xx}(B) = e^{W/2\xi_x}\rho_0(B) \qquad \text{(Equation 9)}$$
$$\frac{16}{\pi}\left[\tanh^{-1}\left(e^{-\pi\frac{W}{L}}\right) + \sinh^2(L/4\xi_y) \cdot \ln\left(1 + e^{-\pi\frac{W}{L}}\right)\right].$$

Equation 7 and its rotation transform along with Equation 4 determiner $\eta$ and $\xi$, in turn.

Substituting into Equation 9 and solving for $\rho_0$ gives an expression for the resistivity which is labeled $\rho_0^a$, $$\rho_0^a(B) = \sqrt{R_{xx}(+B)R_{xx}(-B)} \cdot \qquad \text{(Equation 10)}$$
$$\frac{\pi}{16}\left[\tanh^{-1}\left(e^{-\pi\frac{W}{L}}\right) + \sinh^2\left(\ln\frac{R_{yy}(+B)}{R_{yy}(-B)}\bigg/4\right)\ln\left(1 + e^{-\pi\frac{W}{L}}\right)\right]^{-1}$$

The rotation transformed Equation 10 is labelled $\rho_0^b$, and the most accurate estimate of $\rho_0(B)$ is their average, $$\rho_0(\beta) = \frac{1}{2}[\rho_0^a(B) + \rho_b^0(B)], \qquad \text{(Equation 11)}$$

accurate to within $\delta$.

Equations 10 and 11 generalize the classic van der Pauw equations for the case of a density gradient. The four contacted corners of the sample can all have different local resistivity and density, yet these equations can still estimate the local resistivity in the center of a sample $\rho_0(B)$. The result is plotted in FIG. 2B for sample D4, showing a Drude-like response with very little dependence on B except near B=0 T where quantum phase coherent effects such as weak localization and memory effects as well as electron-electron interactions may play a role. An empirical lower limit for Drude-like behavior as B" can be identified as $B''=2/\mu_0$, which for sample D4 is B"=0.2 T.

The components of the density gradient can be determined from the low-B data. Multiplying Equation 7 and its rotated counterpart on both sides by $\rho_0(B)$ yields the functions:

$$f_x(B) = -\frac{n_0 e}{W}\rho_0(B) \cdot \ln\frac{R_{xx}(+B)}{R_{xx}(-B)} = \eta_x B, \qquad \text{(Equation 12)}$$
$$f_y(B) = -\frac{n_0 e}{L}\rho_0(B) \cdot \ln\frac{R_{yy}(+B)}{R_{yy}(-B)} = \eta_y B.$$

Their slopes in B give the normalized density gradient, $$\nabla n/n_0 = \eta = \left(\frac{df_x}{dB}, \frac{df_y}{dB}\right). \qquad \text{(Equation 13)}$$

In a perfect Drude model, these slopes would persist to B=0 T, but since B" sets the lower limit of the Drude behavior, a linear fit within the domain B"<B<B' can be expected.

FIG. 2C illustrates how the density gradient can be determined graphically. The functions $f_x(B)$ and $f_y(B)$ are plotted along with $1/\mu_0(B)L$ and $-1/\mu_0(B)W$. The condition for $B'_x=1/\mu_0|\eta_x|W$ and $B'_y=1/\mu_0|\eta_y|L$ is graphically determined from their intersection, and the low-B delimiter B' is identified with the lesser of $B'_x$ or $B'_y$. From FIG. 2c, the density gradient components $\eta_x=10\%$ cm$^{-1}$ and $\eta_y=22\%$ cm$^{-1}$ are then extracted from the slopes of the linear fitting lines within the domain B"<B<B'.

Figure 3:
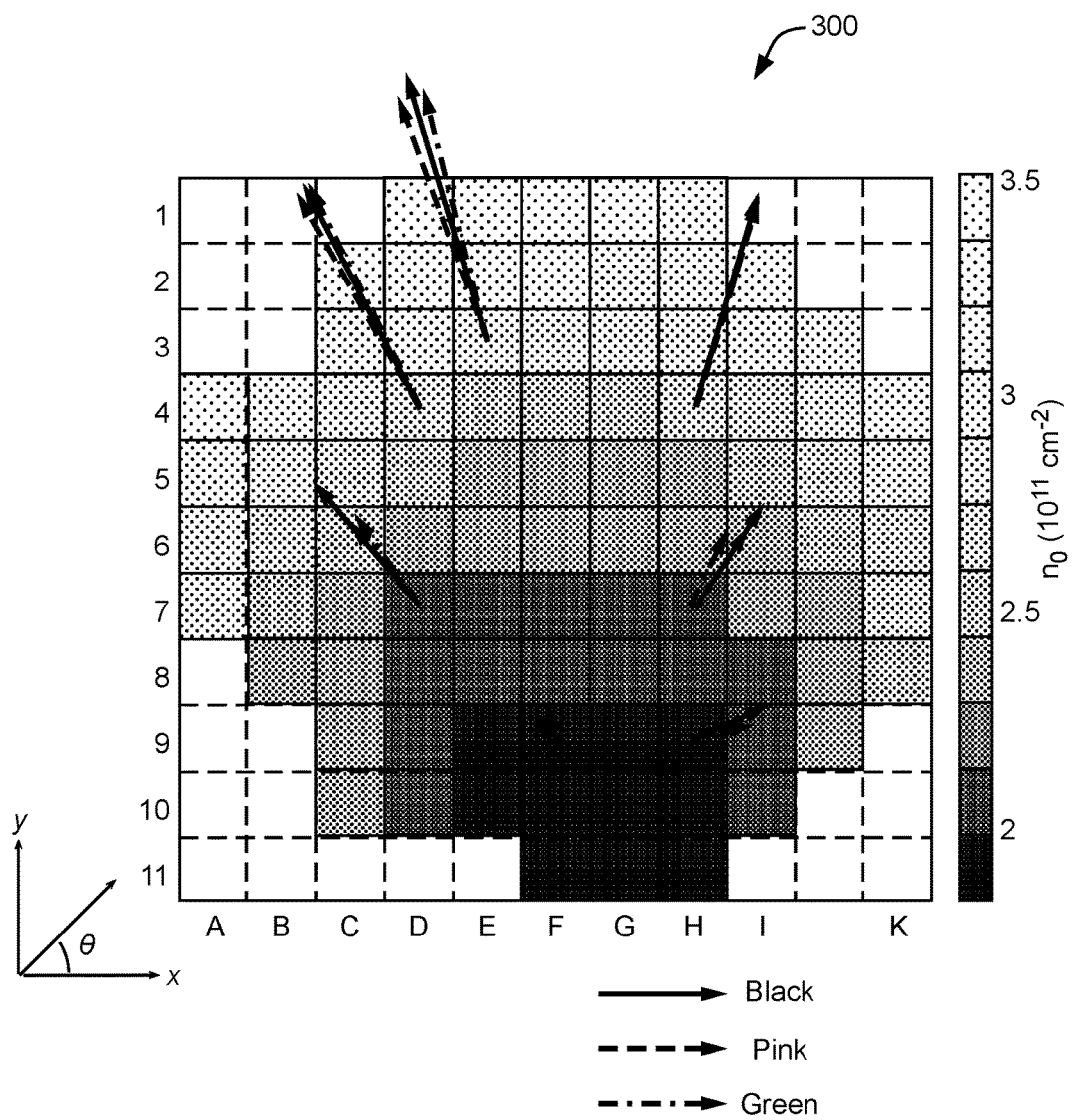
FIG. 3 is a density color map of an example 2-inch GaAs QW wafer calibrated by dicing into 4×4 mm$^2$ samples and measuring the local density $n_o$ of various samples. The black arrows represent calibrated density gradients, and the green and pink represent density gradients deduced using the present method.

FIG. 3 is a density color map 300 of an example 2-inch GaAs QW wafer calibrated by dicing into 4×4 mm$^2$ samples and measuring the local density $\eta_0$ of various samples. Black arrows represent local density gradients $\nabla n_{int}=n_0\eta_{int}$ interpolated from this density map 300. Green arrows represent LMA method density gradients $\nabla n=n_0\eta$ using corner contacts. Pink arrows represent LMA method density gradients $\nabla n=n_0\eta$ using flat contacts. Sample D4 is presented in greater detail (FIGS. 1 and 2). The insert (bottom left) shows axes and angle $\theta$.

The LMA analysis can be verified across an entire wafer by creating an interpolated density map 300. The wafer is illustrated in FIG. 3 with various colored tiles designating the local measured densities. The interpolated normalized density gradients $$\eta_{int} = \frac{\nabla n_{int}}{n_0}$$

can be determined by calculating the first derivative of the density map 300 smoothed via the so-called QR algorithm of numerical linear algebra. In addition to D4, six other samples marked with origins of each arrow in FIG. 3 can be selected, and density gradients $\nabla n_{int}$ determined from the interpolated data are plotted as black arrows. For comparison, the density gradient magnitudes and angles for these same samples were also determined with the LMA method, and $\nabla n=n_0\eta$ is plotted with green arrows.

Conformal equivalence also allows to use four flat contacts at the center of each side to measure the density gradient, provided the resulting angle is rotated by about 45 degrees, with the result plotted in FIG. 3 as the pink arrows. Other rotation angle can be used. The overlap of the gradient vectors verifies the effectiveness of the LMA method for calibrating density gradients.

As FIG. 3 can demonstrate, the LMA analysis can have the practical consequence of providing a quick and simple evaluation of density gradients of 2D conducting layers of single samples, in contrast to the cumbersome task of measuring the densities and mobilities of various neighboring samples. To measure high-mobility samples such as those here, higher temperatures can be used to increase the resistivity $\rho_0$ and thereby increase B' so that a wider range of B-field can be used to extract the density gradient magnitude.

Figure 4:
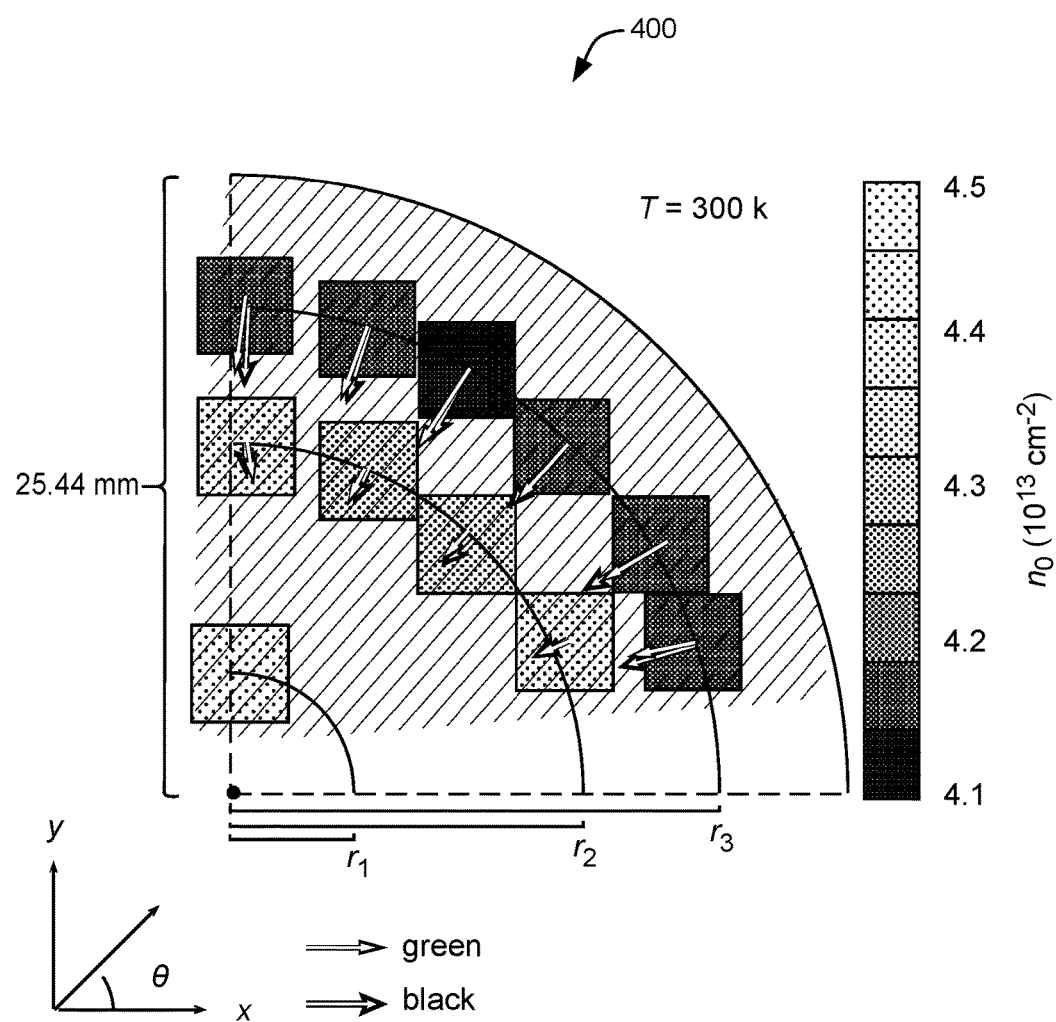
FIG. 4 is a density color map of an example quarter wafer.

FIG. 4 is a density map 400 of an example quarter wafer. As FIG. 4 can demonstrate, the LMA method can also be successfully applied to bulk doped semiconductors and at room temperatures. FIG. 4 illustrates a density map 400 of a quarter wafer of n-GaAs bulk doped grown under rotation, and density gradient vectors measured at room temperature. The squares identify 4×4 mm$^2$ samples at three different radii from the wafer center, $r_1$=0.5 cm, $r_2$=1.4 cm, and $r_3$=2.0 cm. The black arrows represent the calibrated density gradient vectors determined from the measured local density.

The green arrows represent the density gradient vectors measured by the LMA method.

Figure 5A:
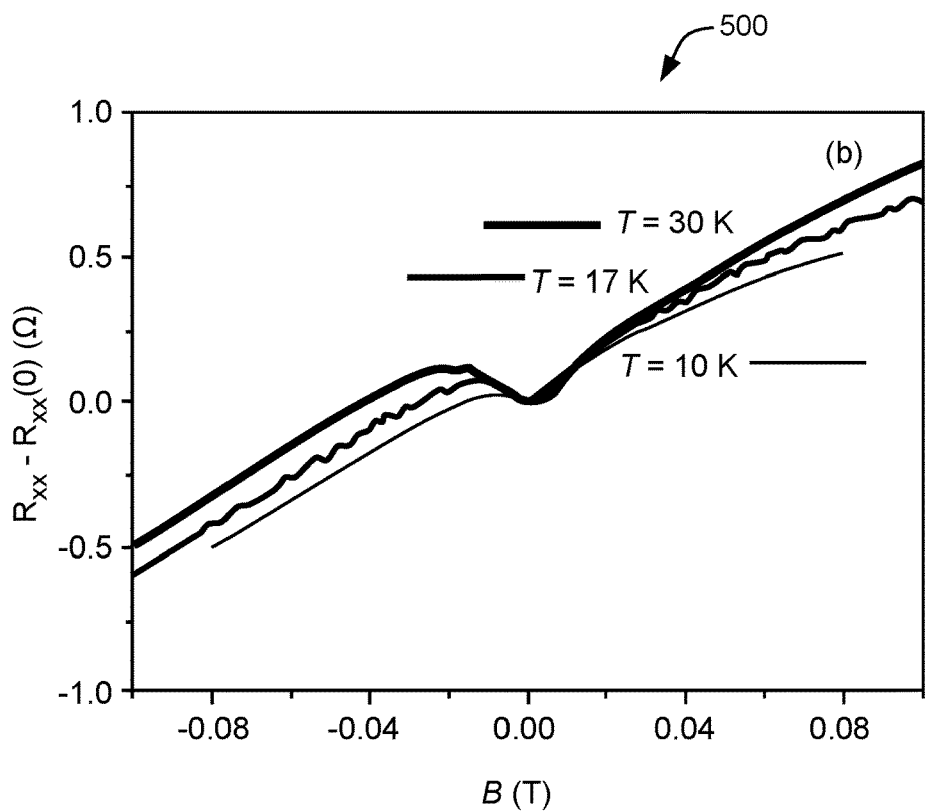
FIG. 5A and 5B are example graphs illustrating how raw resistivity data can be improved and corrected using the LMA method.
Figure 5B:
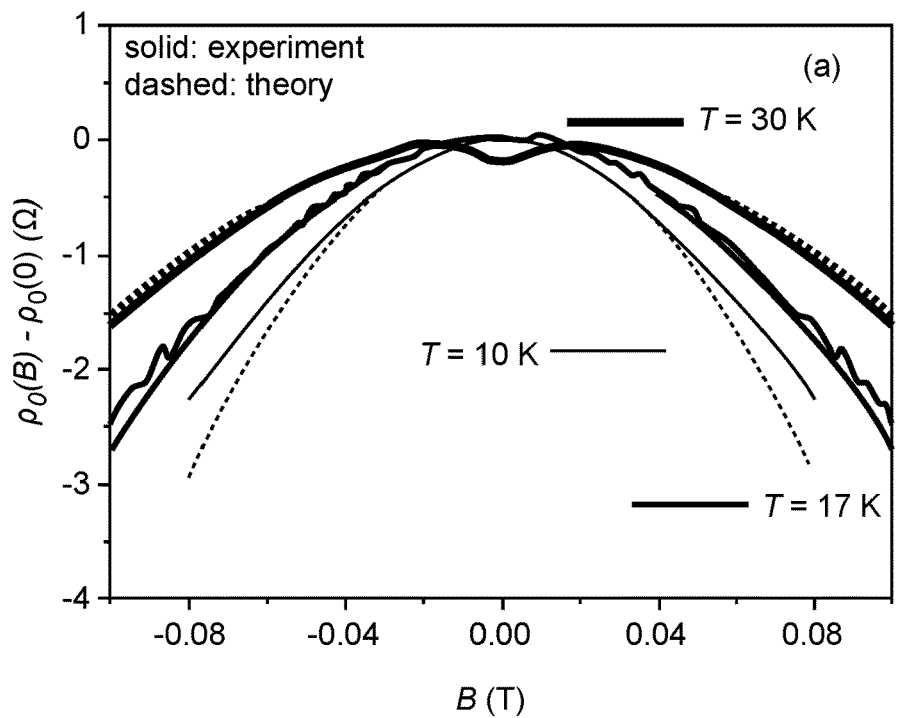

FIGS. 5A and 5B are example graphs 500 illustrating how raw resistivity data can be improved and corrected using the LMA method. In FIG. 5A, the raw longitudinal resistance data from sample D4 at T=30 K, 17 K, and 10 K is highly asymmetric and not suitable for any direct physical interpretation. In FIG. 5B, after correction with the LMA analysis method, the resistivity $\rho_0$ (Equation 11) clearly fits a theoretical trend (dashed lines) resulting from interaction-induced quantum corrections.

Therefore, an asymmetry can be observed in the longitudinal resistance in the QH and Drude regimes, and an analytical model developed to explain the LMA. An LMA system and method are described to quantify the local density gradient in measurements of high-mobility two-dimensional systems as well as bulk doped semiconductor layers. Equations 8 and 10-13 are provided to calculate the angle and magnitude of the density gradient, as well as the local resistivity $\rho_0(B)$, from the longitudinal resistances $R_{xx}$ and $R_{yy}$ in both +B and -B-fields. The density gradient reveals the density distribution of the surrounding area, allowing estimates of neighboring densities to be more accurately made. Examining a few scattered specimen from a large area, the uniformity of density distribution over an entire substrate or wafer can be accurately revealed without testing every position. The systems and methods also allow uniformity of 2D materials to be quantified such as graphene, $MoS_2$, $WS_2$, β-metallic phosphorus, and topological insulators (TI), where individual samples do not have the luxury of having neighboring pieces to determine density gradients, or when large quantity of samples are not available or prohibitively expensive. This can generalize the classic van der Pauw method to the case of a density gradient.

Figure 6:
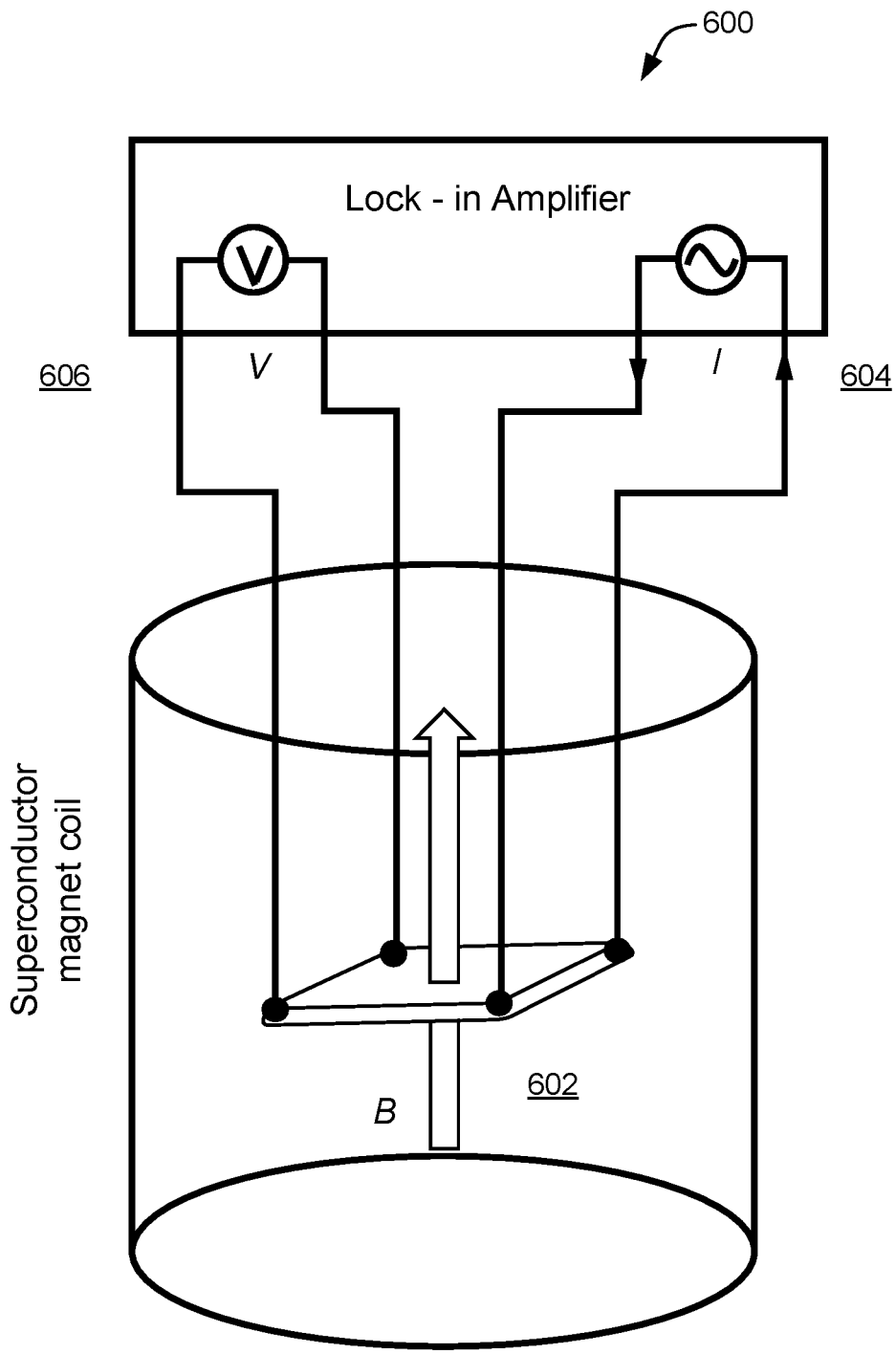
FIG. 6 is a diagram of an example four-point magnetotransport measurement method that utilized a lock-in amplifier.

FIG. 6 is a diagram 600 of an example four-point measurement method that utilized a lock-in amplifier. A magnet cryostat can be used to provide varying magnetic field B 602 while maintaining a fixed sample temperature T. A sample under test is placed at the center of the magnet so that the magnetic field B 602 is perpendicular to the sample. A lock-in amplifier sends a current I 604 through the sample via two current contacts, and measures longitudinal voltage drop V 606 on the sample via two voltage contacts. The four-point longitudinal resistance is then calculated as R=V/I.

The systems and methods described above may be implemented in many different ways in many different combinations of hardware, software firmware, or any combination thereof. In one example, the systems and methods can be implemented with a processor and a memory, where the memory stores instructions, which when executed by the processor, causes the processor to perform the systems and methods. The processor may mean any type of circuit such as, but not limited to, a microprocessor, a microcontroller, a graphics processor, a digital signal processor, or another processor. The processor may also be implemented with discrete logic or components, or a combination of other types of analog or digital circuitry, combined on a single integrated circuit or distributed among multiple integrated circuits. All or part of the logic described above may be implemented as instructions for execution by the processor, controller, or other processing device and may be stored in a tangible or non-transitory machine-readable or computer-readable medium such as flash memory, random access memory (RAM) or read only memory (ROM), erasable programmable read only memory (EPROM) or other machine-readable medium such as a compact disc read only memory (CDROM), or magnetic or optical disk. A product, such as a computer program product, may include a storage medium and computer readable instructions stored on the medium, which when executed in an endpoint, computer system, or other device, cause the device to perform operations according to any of the description above. The memory can be implemented with one or more hard drives, and/or one or more drives that handle removable media, such as diskettes, compact disks (CDs), digital video disks (DVDs), flash memory keys, and other removable media.

The processing capability of the system may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may be implemented in many ways, including data structures such as linked lists, hash tables, or implicit storage mechanisms. Programs may be parts (e.g., subroutines) of a single program, separate programs, distributed across several memories and processors, or implemented in many different ways, such as in a library, such as a shared library (e.g., a dynamic link library (DLL)). The DLL, for example, may store code that performs any of the system processing described above.

While various embodiments have been described, it can be apparent that many more embodiments and implementations are possible. Accordingly, the embodiments are not to be restricted.

We claim:

1. A system, comprising:
   a measuring device including terminal contacts, the terminal contacts contacting a specimen of a semiconductor, where the measuring device applies a current and measures the voltage at the terminal contacts to determine a quality of the specimen in terms of a charge carrier density gradient by measuring two magnetic-field-dependent resistances using the terminal contacts.

2. The system of claim 1, where the measuring device extracts either an angle or a magnitude of the charge carrier density gradient, or both the angle and the magnitude of the charge carrier density gradient.

3. The system of claim 2, where the charge carrier density gradient reveals a density distribution of a surrounding area of the specimen, allowing estimates of neighboring densities to be accurately made.

4. The system of claim 1, where the charge carrier density gradient reveals a density distribution of the surrounding area of the specimen, allowing estimates of neighboring densities to be accurately made.

5. The system of claim 1, further comprising examining a few scattered specimen from a large area of the semiconductor to determine a uniformity of a density distribution over an entire semiconductor without testing every position.

6. The system of claim 1, where an angle of the charge carrier density gradient $$\theta = \tan^{-1}\left(\frac{\eta_y}{\eta_x}\right)$$

is determined by application of magnetic field.

7. The system of claim 1, where a magnitude of the charge carrier density gradient $|\eta|=\sqrt{\eta_x^2+\eta_y^2}$ is determined by application of magnetic field.

8. The system of claim 1, where the terminal contacts rotate the charge carrier density gradient angle by about 45 degrees to measure the charge carrier density gradient.

9. The system of claim 1, where a number of terminal contacts comprises at least four.

10. The system of claim 9, where only two magnetic-field-dependent resistances are measured using the at least four terminal contacts.

11. A method, comprising:
contacting a specimen at terminal contacts;
applying a current and measuring a voltage at the terminal contacts; and
measuring two magnetic-field-dependent resistances using the terminal contacts to determine a quality of the specimen in terms of a charge carrier density gradient.

12. The method of claim 11, where the measuring extracts both an angle and a magnitude of the charge carrier density gradient.

13. The method of claim 12, where the charge carrier density gradient reveals a density distribution of a surrounding area of the specimen, allowing estimates of neighboring densities to be accurately made.

14. The method of claim 11, where the charge carrier density gradient reveals a density distribution of the surrounding area of the specimen, allowing estimates of neighboring densities to be accurately made.

15. The method of claim 11, further comprising:
examining a few scattered specimen from a large area of the semiconductor; and
determining a uniformity of a density distribution over an entire semiconductor without testing every position.

16. The method of claim 11, further comprising determining an angle of the charge carrier density gradient $$\theta = \tan^{-1}\left(\frac{\eta_y}{\eta_x}\right)$$

by applying a magnetic field.

17. The method of claim 11, determining a magnitude of the charge carrier density gradient $|\eta|=\sqrt{\eta_x^2+\eta_y^2}$ from applying a magnetic field.

18. The method of claim 11, further comprising rotating the charge carrier density gradient angle by about 45 degrees to measure the charge carrier density gradient.

19. The method of claim 11, where a number of terminal contacts comprises at least four.

20. The method of claim 19, where only two magnetic-field-dependent resistances are measured using the at least four terminal contacts.

* * * * *